United States Patent
Steiner et al.

(10) Patent No.: US 9,331,667 B2
(45) Date of Patent: May 3, 2016

(54) METHODS, SYSTEMS, AND APPARATUSES FOR TEMPERATURE COMPENSATED SURFACE ACOUSTIC WAVE DEVICE

(71) Applicant: TriQuint Semiconductor, Inc., Hillsboro, OR (US)

(72) Inventors: Kurt Steiner, Orlando, FL (US); Curtiss Hella, Opopka, FL (US); Benjamin P. Abbott, Maitland, FL (US); Daniel Chesire, Winter Garden, FL (US); Chad Thompson, Apopka, FL (US); Alan S. Chen, Windemere, FL (US)

(73) Assignee: TriQuint Semiconductor, Inc., Hillsboro, OR (US)

(*) Notice: Subject to any disclaimer, the term of this patent is extended or adjusted under 35 U.S.C. 154(b) by 0 days.

(21) Appl. No.: 14/337,093

(22) Filed: Jul. 21, 2014

(65) Prior Publication Data

US 2016/0020747 A1 Jan. 21, 2016

(51) Int. Cl.
| | |
|---|---|
| *H04B 1/10* | (2006.01) |
| *H03H 9/02* | (2006.01) |
| *H01L 41/047* | (2006.01) |
| *H01L 41/053* | (2006.01) |
| *H03H 9/25* | (2006.01) |
| *H01L 41/297* | (2013.01) |
| *H04B 1/16* | (2006.01) |
| *H04B 1/40* | (2015.01) |

(52) U.S. Cl.
CPC .......... *H03H 9/02834* (2013.01); *H01L 41/047* (2013.01); *H01L 41/0477* (2013.01); *H01L 41/0533* (2013.01); *H01L 41/297* (2013.01); *H03H 9/25* (2013.01); *H04B 1/16* (2013.01); *H04B 1/40* (2013.01)

(58) Field of Classification Search
CPC .............. Y10T 29/42; Y10T 29/49005; Y10T 29/4908; H03H 3/08; H03H 3/04; H03H 9/02047; H03H 9/02102; H03H 9/02133; H03H 9/02543; H03H 9/02574; H03H 9/02834; H03H 9/02921; H03H 9/0514; H03H 9/172
USPC ........ 455/90.2, 558, 556.1, 557, 64; 370/338, 370/275; 310/313, 346, 310; 29/25.35, 594; 438/687, 628, 763, 791; 333/193, 133, 333/104; 429/212; 257/751, 660, 57; 525/240
See application file for complete search history.

(56) References Cited

U.S. PATENT DOCUMENTS

| | | | | |
|---|---|---|---|---|
| 4,345,176 A | * | 8/1982 | Grudkowski et al. ...... | 310/313 A |
| 4,489,250 A | * | 12/1984 | Ebata et al. ............... | 310/313 A |

(Continued)

OTHER PUBLICATIONS

Miura, M. et al., "Banda Duplexer using ZERO TCF Love wave device," IEEE International Ultrasonics Symposium Proceedings, 2012, pp. 1264-1266.

(Continued)

*Primary Examiner* — Tan H Trinh
(74) *Attorney, Agent, or Firm* — Withrow & Terranova, P.L.L.C.

(57) ABSTRACT

Embodiments described herein may provide a temperature-compensated surface acoustic wave (TCSAW) device, a method of fabricating a TCSAW device, and a system incorporating a TCSAW device. The TCSAW device may include a pyroelectric substrate, a plurality of electrodes formed on a first surface of the pyroelectric substrate, an amorphous silicon layer formed over the plurality of electrodes, and a temperature compensating layer formed over the amorphous silicon layer.

19 Claims, 5 Drawing Sheets

(56) References Cited

U.S. PATENT DOCUMENTS

| | | | |
|---|---|---|---|
| 4,734,698 A * | 3/1988 | Nysen et al. | 342/44 |
| 5,998,907 A * | 12/1999 | Taguchi et al. | 310/313 R |
| 6,377,138 B1 | 4/2002 | Takagi et al. | |
| 7,561,009 B2 * | 7/2009 | Larson, III | H03H 3/04 333/187 |
| 7,802,349 B2 * | 9/2010 | Ruby et al. | 29/25.35 |
| 7,915,166 B1 * | 3/2011 | Yu et al. | 438/687 |
| 2003/0174028 A1 | 9/2003 | Takayama et al. | |
| 2003/0190792 A1 | 10/2003 | Aigner et al. | |
| 2004/0183397 A1 * | 9/2004 | Kam | H03H 9/02574 310/313 R |
| 2004/0256949 A1 | 12/2004 | Hada et al. | |
| 2005/0014360 A1 * | 1/2005 | Yu | H01L 21/76867 438/622 |
| 2006/0118793 A1 * | 6/2006 | Yang | H01L 29/458 257/79 |
| 2006/0135699 A1 * | 6/2006 | Li et al. | 525/240 |
| 2006/0278872 A1 * | 12/2006 | Fang | H01L 29/66765 257/59 |
| 2009/0101903 A1 * | 4/2009 | Chen | H01L 27/124 257/59 |
| 2009/0315182 A1 * | 12/2009 | Besser | H01L 21/76846 257/754 |
| 2010/0187947 A1 | 7/2010 | Mimura | |
| 2010/0272933 A1 | 10/2010 | McCormick et al. | |
| 2011/0159365 A1 * | 6/2011 | Loveness | H01M 4/0428 429/218.1 |
| 2011/0186843 A1 * | 8/2011 | Kim | C23C 14/14 257/57 |
| 2011/0227671 A1 * | 9/2011 | Zhang | H04R 17/00 333/195 |
| 2012/0228752 A1 * | 9/2012 | Huang | 257/660 |
| 2012/0273785 A1 * | 11/2012 | Moriguchi | H01L 27/14692 257/53 |
| 2013/0049533 A1 * | 2/2013 | Matsuda et al. | 310/313 |
| 2013/0049545 A1 * | 2/2013 | Zou | H03H 3/04 310/346 |
| 2013/0057361 A1 * | 3/2013 | Sakano et al. | 333/193 |
| 2013/0099630 A1 * | 4/2013 | Matsuda et al. | 310/346 |
| 2014/0264877 A1 * | 9/2014 | Pfuetzner et al. | 257/751 |
| 2014/0269650 A1 * | 9/2014 | Sahota | 370/338 |
| 2015/0129885 A1 * | 5/2015 | Kim et al. | 257/72 |

OTHER PUBLICATIONS

Parker, T. E. et al., "Temperature-compensated surface-acoustic-wave devices with $SiO_2$ film overlays," Journal of Applied Physics, American Institute of Physics, vol. 50, No. 3, Mar. 1, 1979, pp. 1360-1369.

International Search Report and Written Opinion for PCT/US2015/041152, mailed Oct. 29, 2015, 15 pages.

* cited by examiner

METHODS, SYSTEMS, AND APPARATUSES FOR TEMPERATURE COMPENSATED SURFACE ACOUSTIC WAVE DEVICE

FIELD

Embodiments of the present disclosure generally relate to the field of electronic circuits, and more particularly, to acoustic wave devices.

BACKGROUND

Surface acoustic wave (SAW) devices are used for many applications, such as radio frequency (RF) filters and duplexers. SAW devices combine low insertion loss with good rejection and can achieve broad bandwidths. SAW devices are typically very sensitive to temperature changes. The stiffness of a pyroelectric substrate material may decrease at higher temperatures, which may reduce acoustic velocities. Temperature-compensated SAW (TCSAW) devices have been developed. These TCSAW devices may include an overcoating of interdigital transducers (IDT) structures with layers that increase stiffness at higher temperatures. While these TCSAW devices desirably reduce temperature coefficient of frequency, they are also associated with various reliability challenges.

A pyroelectric effect may charge a substrate of the TCSAW device in proportion to a change in temperature. If the induced charge is of sufficient size, an electrostatic discharge event may occur damaging the TCSAW device.

IDTs of the TCSAW devices may include electrodes having a copper-dominant layer. Under a constant bias, the copper may oxidize, into copper cations, and may migrate through lithium niobate sites in the substrate. The copper cations may be sourced from the electrodes with positive potential and migrate toward the electrodes having negative potential.

The overcoating used to provide temperature compensation in TCSAW devices may be porous to humidity. Therefore, in some situations, the electrodes of the TCSAW devices may corrode due to presence of moisture in the devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 3A-3D illustrate various stages of forming a temperature-compensated surface acoustic wave (TCSAW) device in accordance with some embodiments. In particular.

DETAILED DESCRIPTION

Embodiments of the present disclosure provide techniques and configurations of an acoustic wave device. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A or B" means (A), (B), or (A and B). Thus, "or" is to be treated as an inclusive or unless otherwise stated.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed, disposed, or otherwise configured on a second layer," may mean that the first layer is formed, disposed, or otherwise configured over the second layer, and at least a part of the first layer may be in direct contact (e.g., direct physical and/or electrical contact) or indirect contact (e.g., having one or more other layers between the first layer and the second layer) with at least a part of the second layer.

Figure 1:
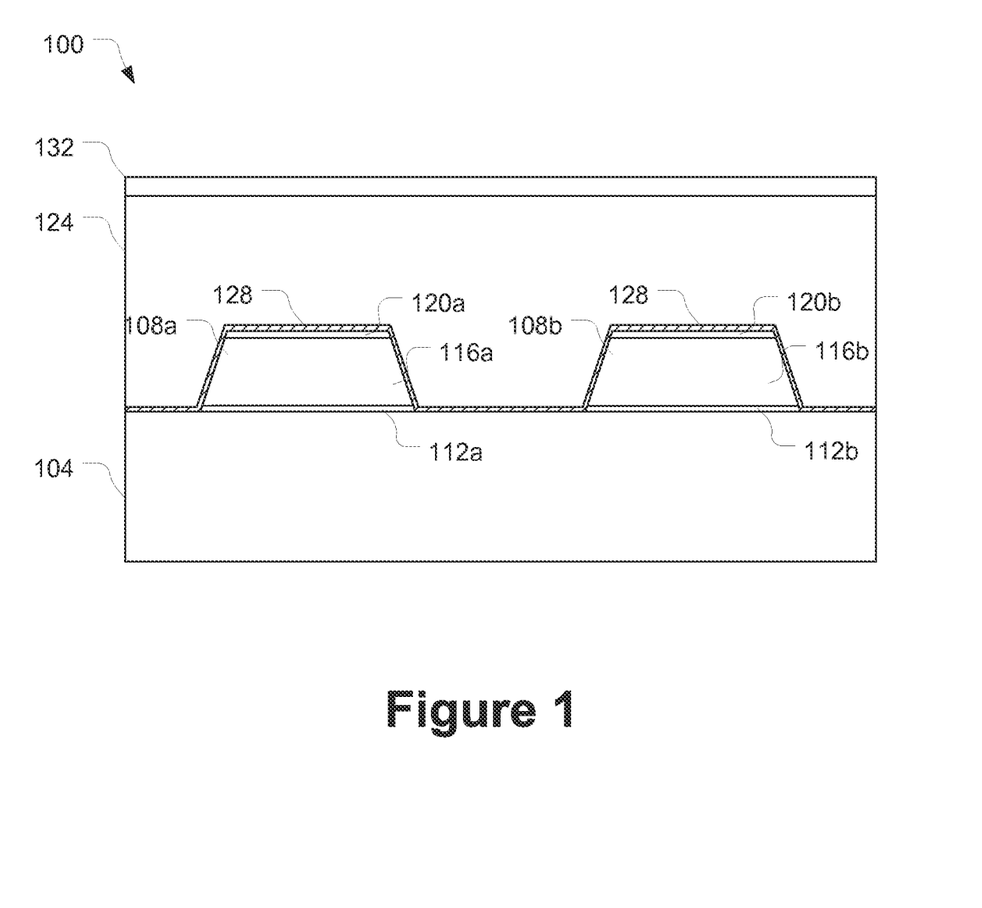
FIG. 1 illustrates a temperature-compensated surface acoustic wave device in accordance with some embodiments.

FIG. 1 schematically illustrates a cross-sectional view of temperature-compensated surface acoustic wave (TCSAW) device 100 in accordance with various embodiments. The TCSAW device 100 may include a substrate 104. In some embodiments, the substrate 104 may include pyroelectric and/or piezoelectric properties and may be composed of lithium niobate ($LiNbO_3$) or of lithium tantalate ($LiTaO_3$).

A plurality of electrodes may be disposed on a surface of the substrate 104. The plurality of electrodes may include, for example, electrodes 108a and 108b. The electrodes 108 may be part of one or more interdigitated transducers (IDTs) formed on a surface of substrate 104. The TCSAW device 100 may convert the acoustic waves present on a surface of the substrate 104 to electrical signals in the IDTs and vice versa by exploiting pyroelectric/piezoelectric effects of the substrate 104.

The electrodes 108 may be multi-layered electrodes including a substrate-adhesion layer 112, a metal-dominant layer 116, and a dielectric-adhesion layer 120.

The substrate-adhesion layer 112 may be a seed layer that is initially formed on the substrate 104 to facilitate subsequent formation of the layers of the electrodes 108. In various embodiments, the substrate-adhesion layer 112 may include titanium or other suitable materials. In some embodiments, the substrate-adhesion layer 112 may be a titanium layer having a thickness of approximately 150 Å. Thickness, as described herein, may refer to a dimension of the corresponding component in the vertical direction as illustrated in FIG. 1.

The metal-dominant layer 116 may be composed of an electrically conductive metal such as, for example, copper, molybdenum, aluminum, etc. In some embodiments, the metal-dominant layer 116 may be a copper-dominant layer or a molybdenum-dominant layer. In some embodiments, the metal-dominant layer 116 may have a thickness of approximately 1000-2000 Å.

The dielectric-adhesion layer 120 may be composed of a material to facilitate coupling of the electrodes 108 with under-bump metallurgy (UBM), which may serve as a connection for subsequent processing. The dielectric-adhesion layer 120 may further serve as a reactive ion etch (RIE) stop when opening vias for the UBM and may further provide a soft contact surface for frequency probing. In some embodiments, the dielectric-adhesion layer 120 may be composed of aluminum or other suitable materials. In some embodiments, the dielectric-adhesion layer 120 may be an aluminum layer having a thickness of approximately 300 Å.

An amorphous-silicon (a-Si) layer 128 may be formed over the electrodes 108 and the portions of the substrate 104 that are not covered by the electrodes 108. The a-Si layer 128 may be composed of amorphous silicon, which may be the non-crystalline allotropic form of silicon. The a-SI layer 128 may be a thin-film with a thickness of approximately 50 Å and may have a low, non-zero, electrical conductivity. The a-Si layer 128 may have any conductivity greater than zero that will allow discharge and is otherwise suitable for the desired embodiments.

In embodiments in which the metal-dominant layer 116 includes copper, the forming of the a-SI layer 128 may result in a copper silicide ($Cu_5Si$) sidewall being formed on the portion of the electrodes 108 in which the a-Si layer 128 is in direct contact with the copper of the metal-dominant layer 116.

The TCSAW device 100 may further include the TC layer 124 formed over the a-Si layer 128. The TC layer 124 may have a thickness of approximately 1µ and may be formed of a silicon dioxide, for example, $SiO_X$ with X~2, that increase stiffness at higher temperatures to compensate for temperature effects, for example, to reduce a temperature coefficient of frequency of the TCSAW device 100.

In some embodiments, the TCSAW device 100 may further include a cap layer 132 formed over the TC layer 124. The cap layer 132 may function to prevent moisture from entering the porous TC layer 124. The cap layer 132 may also be used to trim, or adjust, a resonant frequency of the TCSAW device 100. The frequency trimming effect of the cap layer 132 may be adjusted by adjusting a thickness of the cap layer 132. The cap layer 132 may be composed of $Si_YN_Z$ wherein Y is approximately 3 and Z is approximately 4. In some embodiments, the cap layer 132 may include a thickness of anywhere between 200-2000 Å.

Forming the a-Si layer 128 over the electrodes 108 and substrate 104, as shown and described above, provides a number of operational advantages to the TCSAW device 100.

For example, as alluded to above, the substrate 104 may have a pyroelectric effect that charges the substrate 104 in proportion to a change in temperature. If not addressed, and the induced charge is of sufficient size, an ESD event may occur, which may damage the device. In the described embodiments, the slightly conductive a-Si layer 128 may provide an electrical conduction path between the electrodes 108 that may electrically dissipate charge produced by a pyroelectric effect of the substrate 104. By appropriately dissipating the charge, the TCSAW device 100 may not be damaged from ESD events as described above with respect to related art.

Another operational advantage may be in embodiments in which the copper silicide sidewalls are formed. Copper silicide may be an intermediate between an ionic compound an alloy and may be insoluble in water. The copper silicide sidewalls may, therefore, provide a reliable passivation layer and a diffusion/electromigration barrier.

To illustrate the effect of the electromigration barrier, consider a prior art SAW device under a DC bias in which the copper oxidizes to copper cations (Cu+) and migrate through Li-sites in the lithium niobate substrate from one electrode to another. Providing the copper silicide sidewalls may at least inhibit this Cu+ migration.

In yet another operational advantage, the a-Si layer 128 may provide an additional moisture barrier. As discussed above, a thickness of the cap layer 132 may be adjusted to adjust the frequency trimming effect of the cap layer 132. In some embodiments, it may be desirable, from a frequency trimming perspective, to have a very thin cap layer 132, for example, approximately 300 Å. A cap layer 132 that is this thin may not provide a sufficient moisture barrier in prior art TCSAW devices. However, the additional moisture barrier function of the a-Si layer 128 may enable the use of a thinner cap layer. This may, in turn, increase the flexibility of adjusting the frequency trimming function of the cap layer 132.

Figure 2:
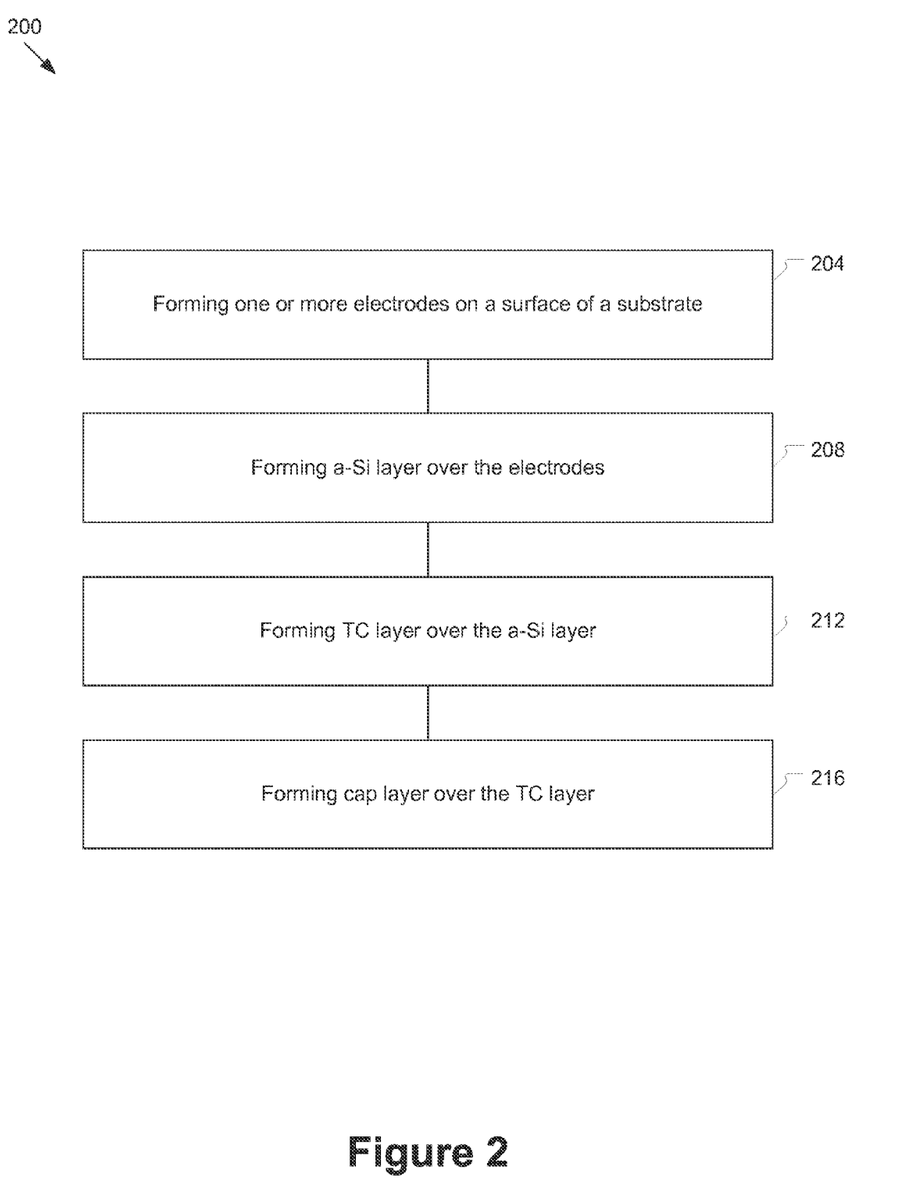
FIG. 2 illustrates a method of forming a temperature-compensated surface acoustic wave device in accordance with some embodiments.

FIG. 2 illustrates a method 200 of forming a TCSAW device in accordance with various embodiments. The method 200 is described with reference to the TCSAW device 100 of FIG. 1, with FIGS. 3A-3D showing TCSAW device 100 after various operations of the method 200, however, it will be appreciated that the method 200 may be modified to form any of the acoustic wave devices described herein.

Furthermore, various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 3A:
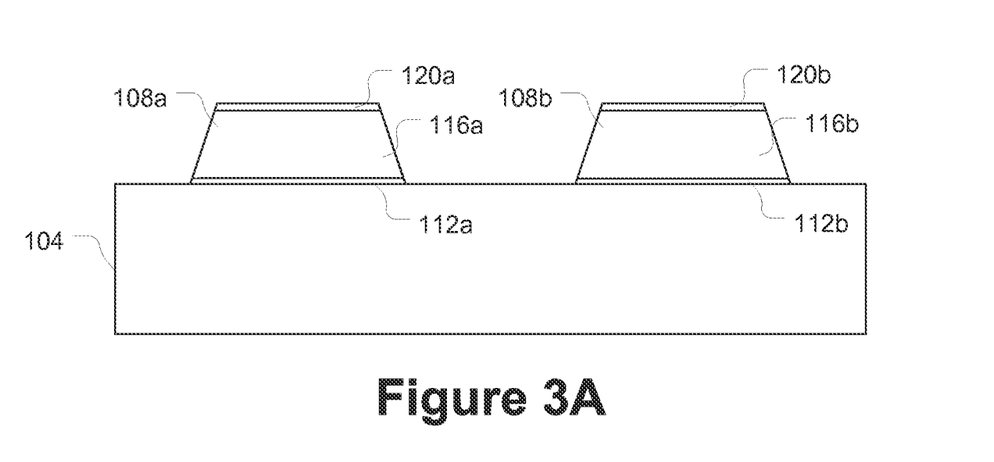
FIG. 3A illustrates a first stage of forming a TCSAW device.

At block 204, the method 200 may include forming the one or more electrodes 108 on a surface of the substrate 104. This processing step is shown in FIG. 3A. The electrodes 108 may be formed by patterning substrate adhesion layers 112 on the substrate 104; followed by patterning conductive material of the metal-dominant layers 116 over the substrate-adhesion layers 112; followed by patterning of the dielectric-adhesion layers 120 over the metal-dominant layers 116. The layers of the electrodes 116 may be formed by any suitable process.

Figure 3B:
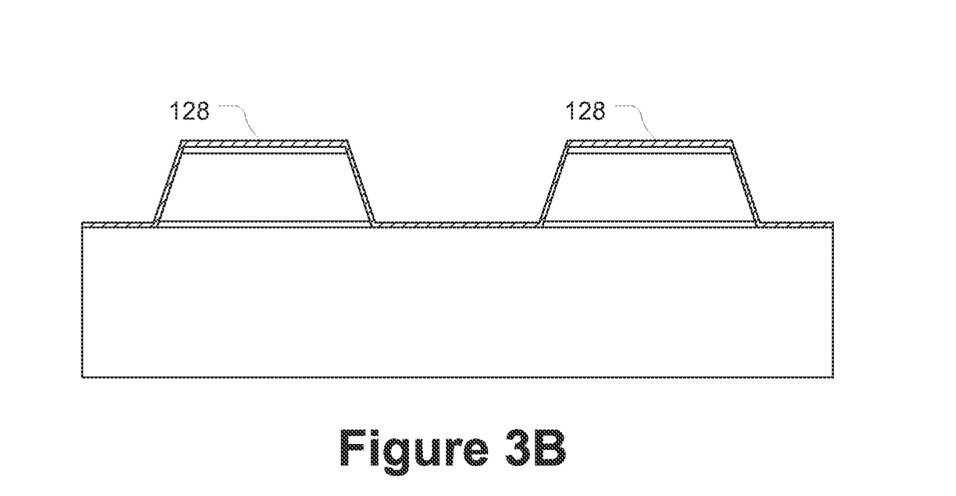
FIG. 3B illustrates a second stage of forming a TCSAW device.

At block 208, the method 200 may include forming the a-Si layer 128 over the electrodes 108. This processing step is shown in FIG. 3B. The a-Si layer 128 may be formed in a plasma-enhanced chemical vapor deposition (CVD) chamber. The formation process may be done at a relatively low pressure using parallel plates with a wafer, including the substrate 104 and electrodes 108, being positioned on a ground plate. The chamber may be evacuated, then flooded with ammonia. The ammonia may be diluted with argon or helium to generate a stable ammonia plasma. Exposing the plurality of electrodes to ammonia plasma may clean surfaces of the exposed native metal, for example, copper, on sidewalls of the electrodes by removing oxide from the exposed native metal. The plasma may be turned off and the chamber may be purged with argon or helium. A silane gas may be introduced and a silane plasma may be struck. The silane gas may be used to form copper silicide on the sidewalls of the electrodes 108.

Figure 3C:
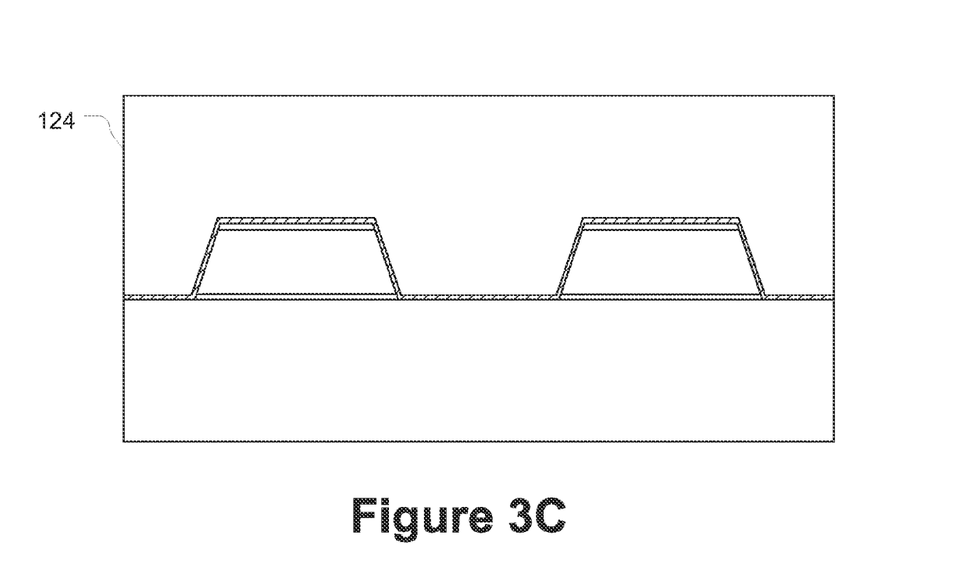
FIG. 3C illustrates a third stage of forming a TCSAW device.

At 212, the method 200 may include forming the TC layer 124 over the electrodes 108. This processing step is shown in FIG. 3C. The TC layer 124 may be formed by depositing, for example by physical vapor deposition (PVD), a planarizing oxide, for example, silicon dioxide, over the electrodes 108.

Figure 3D:
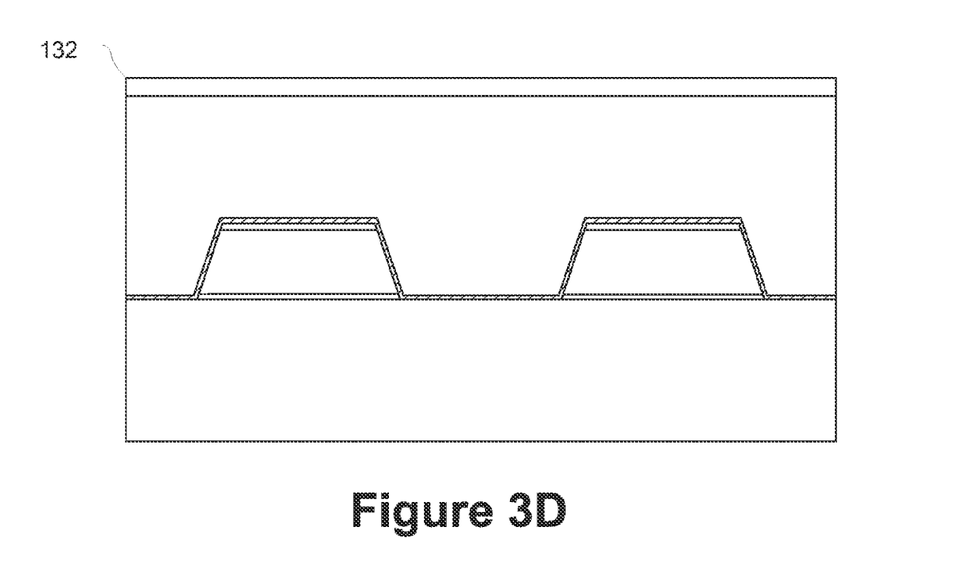
FIG. 3D illustrates a fourth stage of forming a TCSAW device.

At 216, the method 200 may include forming the cap layer 132 over the TC layer 124. This processing step is shown in FIG. 3D. The forming of the cap layer 132 may include depositing, for example by PVD or plasma-enhanced chemical vapor deposition (PECVD), silicon nitride or other suitable material, over the TC layer 124. The cap layer 132 may be initially deposited with a first thickness, for example, 1000 Å, and may subsequently be etched or ion-milled to a second thickness that provides a desired frequency-trimming effect.

Figure 4:
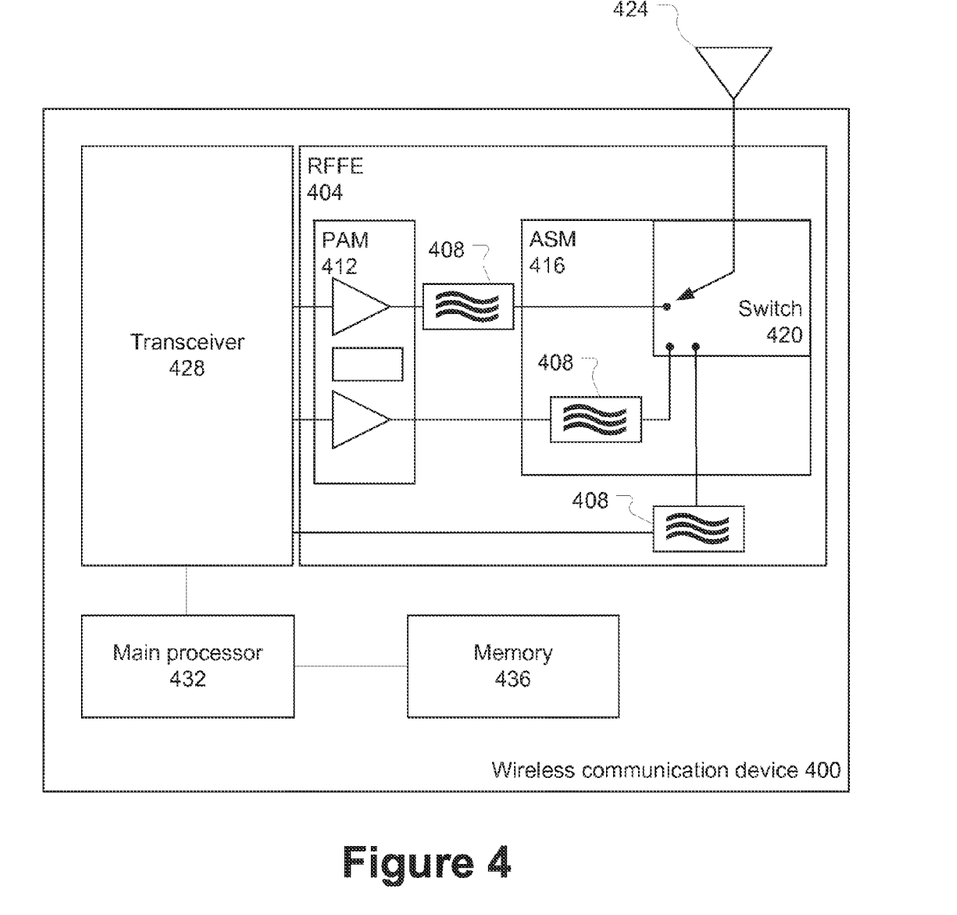
FIG. 4 schematically illustrates an example system including an acoustic wave device, according to various embodiments.

Embodiments of a TCSAW device described herein, for example, TCSAW device 100, and apparatuses including such TCSAW devices may be incorporated into various other apparatuses and systems. A block diagram of an exemplary wireless communication device 400 is illustrated in FIG. 4 in accordance with some embodiments. Wireless communication device 400 may have an RF front end (RFFE) 404 including one or more acoustic-wave filters 408 coupled with a power amplifier module (PAM) 412. The acoustic wave filters 1008 may include, for example, TCSAW device 100. Additionally, or alternatively, the acoustic-wave filters 1008 may be formed by method 200.

The acoustic-wave filters 408 may operate to filter frequencies of transmitted/received signals. In some embodiments, the acoustic-wave filters 408 may be integrated with an antenna switch module (ASM) 416. Acoustic-wave filters 408 may additionally or alternatively be disposed external to the ASM 416 as shown.

The ASM 416 may include, in addition to one or more acoustic-wave filters 408, a switch 420 coupled with an antenna 424. In various embodiments, the antenna 424 may include one or more directional and/or omnidirectional antennas, including, for example, a dipole antenna, a monopole antenna, a patch antenna, a loop antenna, a microstrip antenna or any other type of antenna suitable for OTA transmission/reception of RF signals.

The switch 420 may selectively couple the antenna 424 with various transmit or receive chains. While the wireless communication device 1000 is described with transmitting and receiving capabilities, other embodiments may include devices with only transmitting or only receiving capabilities.

The PAM 412 may be a multimodal, multi band power amplifier (MMPA) that integrates a plurality of power amplifiers and control logic to support various frequency bands and communication modes. The PAM 412 may amplify radio frequency signals received from a transceiver 428 for transmission via the ASM 416 and the antenna 424.

The transceiver 428 may receive outgoing data (e.g., voice data, web data, e-mail, signaling data, etc.) from a main processor 432, may generate RF signals to represent the outgoing data, and provide the RF signal(s) to the RFFE 404. In some embodiments, the transceiver 428 may generate the RF signals using OFDM modulation.

In a similar manner, the transceiver 428 may receive an incoming over-the-air signal from the antenna 424 through the RFFE 404. The transceiver 428 may process and send the incoming signal to the main processor 432 for further processing.

The main processor 432 may execute a basic operating system program, stored in memory 436, in order to control the overall operation of the wireless communication device 400. For example, the main processor 432 may control the reception of signals and the transmission of signals by transceiver 428. The main processor 432 may be capable of executing other processes and programs resident in the memory 436 and may move data into or out of memory 436, as desired by an executing process.

In various embodiments, the wireless communication device 400 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

Those skilled in the art will recognize that the wireless communication device 400 is given by way of example and that, for simplicity and clarity, only so much of the construction and operation of the wireless communication device 400 as is necessary for an understanding of the embodiments is shown and described. Various embodiments contemplate any suitable component or combination of components performing any suitable tasks in association with wireless communication device 400, according to particular needs. Moreover, it is understood that the wireless communication device 400 should not be construed to limit the types of devices in which embodiments may be implemented.

Various examples are provided below.

Example 1 includes a temperature-compensated (TC) surface acoustic wave (SAW) device comprising: a substrate; a plurality of electrodes formed on first surface of the substrate; an amorphous silicon layer formed over the plurality of electrodes; and a temperature compensating layer formed over the amorphous silicon layer.

Example 2 includes the TCSAW device of example 1, wherein individual electrodes of the plurality of electrodes include: a copper layer with copper silicide sidewalls at an interface of the amorphous silicon layer and the copper layer.

Example 3 includes the TCSAW device of example 2, wherein the copper silicide sidewalls are to provide a barrier to electromigration of copper cations or a moisture barrier to suppress corrosion of copper.

Example 4 includes the TCSAW device of example 3, wherein the copper silicide sidewalls are to provide a barrier to electromigration of capper cations and a moisture barrier to suppress corrosion of copper.

Example 5 includes the TCSAW device of example 1, wherein the temperature compensating layer comprises $SiO_X$ where X is approximately 2.

Example 6 includes the TCSAW device of example 1, further comprising: a cap layer formed over the temperature-compensating layer, the top layer to inhibit moisture or trim frequency.

Example 7 includes the TCSAW device of example 6, wherein the cap layer comprises $SiY_NZ$ wherein Y is approximately 3 and Z is approximately 4.

Example 8 includes the TCSAW device of example 6, wherein the cap layer is approximately 300 Å.

Example 9 includes the TCSAW device of example 1, wherein individual electrodes of the plurality of electrodes include a substrate-adhesion layer, a metal-dominant layer, and a dielectric-adhesion layer.

Example 10 includes the TCSAW device example 9, wherein the substrate adhesion layer is a titanium layer and has a thickness of approximately 150 Å; the metal dominant layer has a thickness of approximately 2000 Å; and the dielectric-adhesion layer is an aluminum layer and has a thickness of approximately 300 Å.

Example 11 includes the TCSAW device of example 9, wherein the metal-dominant layer is a copper-dominant layer or a molybdenum-dominant layer.

Example 12 includes the TCSAW device of example 1, wherein the pyroelectric substrate is a lithium niobate substrate or a lithium tantalate substrate.

Example 13 includes the TCSAW device of example 1, wherein the amorphous silicon layer is to electrically dissipate a charge produced by a pyroelectric effect of the substrate.

Example 14 includes the TCSAW device of example 1, wherein the amorphous silicon layer is to at least reduce a possibility of an electrostatic discharge event with respect to the TCSAW device.

Example 15 includes a method for forming an acoustic wave device comprising: providing a substrate; forming a plurality of electrodes on the substrate, wherein individual electrodes of the plurality of electrodes include a metal-dominant layer; and forming an amorphous silicon layer over the plurality of electrodes.

Example 16 includes the method of example 15, wherein said forming the amorphous silicon layer comprises: exposing the plurality of electrodes to a silane plasma.

Example 17 includes the method of example 15, wherein the metal-dominant layer is a copper-dominant layer and the method further comprises: forming copper silicide sidewalls on the plurality of electrodes by said exposing the plurality of electrodes to the silane plasma.

Example 18 includes the method of example 17, wherein said forming of the plurality of electrodes comprises: exposing the plurality of electrodes to ammonia plasma to reduce oxide on sidewalls of the copper-dominant layer prior to said exposing the plurality of electrodes to the silane plasma.

Example 19 includes a radio frequency front end having: a power amplifier module including one or more power amplifiers to amplify a radio frequency signal; an acoustic-wave filter coupled with the power amplifier module, the acoustic-wave filter to include a temperature-compensated (TC) surface acoustic wave (SAW) device having: a substrate; a plurality of electrodes formed on first surface of the substrate; an amorphous silicon layer formed over the plurality of electrodes; and a temperature compensating layer formed over the amorphous silicon layer.

Example 20 includes a wireless communication device comprising: a transceiver to generate outgoing signals; and the radio frequency front end of example 19 coupled with the transceiver.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A temperature-compensated (TC) surface acoustic wave (SAW) device comprising:
   a substrate;
   a plurality of electrodes formed on first surface of the substrate;
   an amorphous silicon layer formed over the plurality of electrodes, wherein individual electrodes of the plurality of electrodes include a copper layer with copper silicide sidewalls at an interface of the amorphous silicon layer and the copper layer; and
   a temperature compensating layer formed over the amorphous silicon layer.

2. The TCSAW device of claim 1, wherein the copper silicide sidewalls are to provide a barrier to electromigration of copper cations or a moisture barrier to suppress corrosion of copper.

3. The TCSAW device of claim 2, wherein the copper silicide sidewalls are to provide a barrier to electromigration of capper cations and a moisture barrier to suppress corrosion of copper.

4. The TCSAW device of claim 1, wherein the temperature compensating layer comprises $SiO_X$, where X is approximately 2.

5. The TCSAW device of claim 1, further comprising:
   a cap layer formed over the temperature-compensating layer to inhibit moisture or trim frequency.

6. The TCSAW device of claim 5, wherein the cap layer comprises $Si_YN_Z$ wherein Y is approximately 3 and Z is approximately 4.

7. The TCSAW device of claim 5, wherein the cap layer is approximately 300 Å.

8. The TCSAW device of claim 1, wherein the individual electrodes of the plurality of electrodes include a substrate-adhesion layer, a metal-dominant layer, and a dielectric-adhesion layer.

9. The TCSAW device claim 8, wherein the substrate adhesion layer is a titanium layer and has a thickness of approximately 150 Å; the metal dominant layer has a thickness of approximately 2000 Å; and the dielectric-adhesion layer is an aluminum layer and has a thickness of approximately 300 Å.

10. The TCSAW device of claim 8, wherein the metal-dominant layer is a copper-dominant layer or a molybdenum-dominant layer.

11. The TCSAW device of claim 1, wherein the pyroelectric substrate is a lithium niobate substrate or a lithium tantalate substrate.

12. The TCSAW device of claim 1, wherein the amorphous silicon layer is to electrically dissipate a charge produced by a pyroelectric effect of the substrate.

13. The TCSAW device of claim 1, wherein the amorphous silicon layer is to at least reduce a possibility of an electrostatic discharge event with respect to the TCSAW device.

14. A method for forming an acoustic wave device comprising:
   providing a substrate;
   forming a plurality of electrodes on the substrate, wherein individual electrodes of the plurality of electrodes include a metal-dominant layer that is a copper-dominant layer;
   forming an amorphous silicon layer over the plurality of electrodes; and
   forming copper silicide sidewalls on the plurality of electrodes at an interface of the amorphous silicon layer and the copper layer.

15. The method of claim 14, wherein said forming the amorphous silicon layer comprises:
   exposing the plurality of electrodes to a silane plasma.

16. The method of claim 15, wherein the method further comprises:
   forming the copper silicide sidewalls on the plurality of electrodes by exposing the plurality of electrodes to the silane plasma.

17. The method of claim 16, wherein said forming of the plurality of electrodes comprises:
- exposing the plurality of electrodes to ammonia plasma to reduce oxide on sidewalls of the copper-dominant layer prior to said exposing the plurality of electrodes to the silane plasma.

18. A radio frequency front end having:
- a power amplifier module including one or more power amplifiers to amplify a radio frequency signal;
- an acoustic-wave filter coupled with the power amplifier module, the acoustic-wave filter to include a temperature-compensated (TC) surface acoustic wave (SAW) device having:
  - a substrate;
  - a plurality of electrodes formed on first surface of the substrate;
  - an amorphous silicon layer formed over the plurality of electrodes, wherein individual electrodes of the plurality of electrodes include a copper layer with copper silicide sidewalls at an interface of the amorphous silicon layer and the copper layer; and
  - a temperature compensating layer formed over the amorphous silicon layer.

19. A wireless communication device comprising:
- a transceiver to generate outgoing signals; and
- the radio frequency front end of claim 18 coupled with the transceiver.

* * * * *